(12) United States Patent
Olsen

(10) Patent No.: US 8,952,264 B2
(45) Date of Patent: Feb. 10, 2015

(54) PRINTED CIRCUIT BOARD

(75) Inventor: Conny Olsen, Segeltorp (SE)

(73) Assignee: Telefonaktiebolaget L M Ericsson (publ), Stockholm (SE)

(*) Notice: Subject to any disclaimer, the term of this patent is extended or adjusted under 35 U.S.C. 154(b) by 229 days.

(21) Appl. No.: 13/500,472

(22) PCT Filed: Dec. 21, 2009

(86) PCT No.: PCT/SE2009/051475
§ 371 (c)(1),
(2), (4) Date: Apr. 5, 2012

(87) PCT Pub. No.: WO2011/046479
PCT Pub. Date: Apr. 12, 2011

(65) Prior Publication Data
US 2012/0193128 A1 Aug. 2, 2012

Related U.S. Application Data

(60) Provisional application No. 61/252,407, filed on Oct. 16, 2009.

(51) Int. Cl.
*H05K 1/11* (2006.01)
*H05K 1/02* (2006.01)

(52) U.S. Cl.
CPC ............ *H05K 1/112* (2013.01); *H05K 1/025* (2013.01); *H05K 1/0224* (2013.01); *H05K 2201/09236* (2013.01); *H05K 2201/09381* (2013.01)
USPC ........................................... 174/262; 361/774

(58) Field of Classification Search
CPC ............................... H05K 1/115; H05K 1/116
USPC .................................. 174/262–266; 361/774
See application file for complete search history.

(56) References Cited

U.S. PATENT DOCUMENTS

| 6,037,547 | A | 3/2000 | Blish, II | |
|---|---|---|---|---|
| 6,803,527 | B2 * | 10/2004 | Dishongh et al. | 174/260 |
| 7,045,719 | B1 * | 5/2006 | Alexander et al. | 174/262 |

* cited by examiner

*Primary Examiner* — Jeremy C Norris

(57) ABSTRACT

Embodiments of the present invention provide a multi layered printed circuit board, PCB, with via holes connecting different signal layers of the PCB. The via holes are connected to pads in the signal layers and are surrounded by anti-pads in the ground layers. In accordance with further embodiments of the invention the pads have a shape wherein a first path, stretching from the center of the pad and substantially in a direction in which adjacent routing channels extend, to a first point located on the edge of the pad, is longer than a second path, stretching from the center of the pad and substantially in a direction towards the adjacent routing channels to a second point located on the edge of the pad.

17 Claims, 13 Drawing Sheets

PRINTED CIRCUIT BOARD

This application claims the benefit of U.S. Provisional Application No. 61/252,407, filed Oct. 16, 2009, the disclosure of which is fully incorporated herein by reference.

TECHNICAL FIELD

The present invention relates to a multi-layered printed circuit board, having via holes connecting different layers.

BACKGROUND

A printed circuit board (PCB) is a board of laminated insulator material with routing channels, also called conductive traces, on the surface and embedded in the PCB. The routing channels interconnect the components (for example, transistors, diodes, resistors, LEDs, connectors, etc) that are placed on the surface(s) of the PCB. The main body of the PCB is made up of different layers laminated together. The laminate material is an electrical insulator and can be made of e.g. epoxy and fiberglass. The electrical connections on the PCB are practically always made up of copper, e.g. the routing channels are made up by strips of copper, called micro strips on the outer layers and strip lines on the inner layers, connecting different components. A layer of the PCB that contains routing channels is called a conductive layer or a signal layer. A PCB can have a plurality of conductive layers, wherein the routing channels of the inner conductive layers are buried inside the insulator. In between different conductive layers, a ground layer, which is a layer that is entirely at ground potential, may be arranged.

In order to connect different conductive layers of a PCB so called via holes are arranged in the PCB. Via holes are conductively plated on their interior surface and routing channels on the conductive layers may be connected to the via holes through a so called pad surrounding the via hole. Via holes can protrude all the way through a PCB or they can be buried, which means that the via holes interconnects internal layers and cannot be seen from the exterior of the PCB. Via holes can also be blind, which means that they can be seen from one side of the PCB. When fabricating multilayer PCBs having a plurality of conductive layers, often the pads in different layers are connected using a special copper plating process commonly referred to as a plated through hole (PTH). PTHs allow interconnectivity between layers on via holes and are produced/drilled after the different layers of the PCB are pressed together. In ground layers the PTHs that are carrying signals are surrounded by so called anti-pads, which basically is copper that has been etched away around a via or a PTH on a ground layer and thereby prevents electrical connection to the layer from the via or PTH.

PCB's usually have a foot-print of PTHs for press-fit or soldered connectors that have a predefined hole pattern. Pads that surround PTHs have a specified diameter to handle production tolerances and also ensure connection to the inner layers in the PCB. The pads have a minimum diameter depending on the drilled diameter of the PTH, which is specified depending on the connector type. Circular pads are normally used for plated through holes in PCBs. Each connector type has a unique connector foot-print consisting of PTHs in the PCB for the signal pins and the ground pins.

In the (near) future products will be based on high speed technologies for bit rates above 10 Gb/s single lane. For a successful transmission link all interconnection elements require optimized electrical performance. A transmission link may comprise transceivers, connectors and PCBs. The layout of current PCBs is adding discontinuities which are reducing the signal quality. PTHs, impedance mismatch of transmission lines, bends on routing channels, ground return coverage in adjacent layers, crosstalk, etc., are some factors that reduce the signal quality.

For high speed connectors the number of signal interfaces per area is increasing and therefore also the density of the connector foot-print to an associated PCB is increasing. The routing channels should then be made as large as possible since small routing channels through the connector foot-prints results in reduced signal performance depending on crosstalk, impedance mismatch, increased insertion loss, etc. Large routing channels result in that the anti-pads should be made as small as possible. Large anti-pads make manufacturing easy but reduce the area in which routing channels may be arranged in adjacent layers, since it is not preferred to route high speed channels over a ground layer having large anti-pads where the routing channels may be passing over an area in an adjacent layer without copper. However, small anti-pads lead to discontinuity at PTHs depending on the capacitance between the pad and an adjacent ground layer.

SUMMARY

An object of the present invention is therefore to provide a printed circuit board with a design that allows large routing channels at the same time as a low capacitance between adjacent layers can be accomplished.

According to the invention a multi-layered printed circuit board, PCB, is disclosed. The PCB comprises a number of signal layers with routing channels and at least one ground layer adjacent to a signal layer. A number of via holes connect different signal layers of the PCB and the via holes are connected to pads in the signal layers and surrounded by anti-pads in the ground layer(s). According to the invention one or more pads, preferably a plurality of pads, have a shape such that a first path (an imaginary line), stretches from the center of the pad and substantially in a direction in which an adjacent routing channel extend, to a first point located on the edge of the pad and the first path is longer than a second path. The second path stretches from the center of the pad and substantially in a direction perpendicular towards the extension direction of the adjacent routing channel, to a second point located on the edge of the pad. The second path, that is directed towards the adjacent routing channel, may be shorter than the radius of the via hole plus the total manufacturing tolerance. Alternatively the second path can be defined as being longer than the radius of the via hole but shorter than, or approximately equal to, the length of the first path minus 0.3 times the radius of the via hole. An advantage with such a layout of the PCB is that a reduced capacitance between adjacent layers and/or increased routing channels can be accomplished.

According to a further embodiment of the invention the second path is shorter than the radius of the via hole divided by $\sqrt{2}$, plus the total manufacturing tolerance. Thereby a further reduction in capacitance between adjacent layers can be accomplished.

According to a yet further embodiment of the invention, the second path is approximately equal to the radius of the via hole or slightly longer. Thereby a yet further reduction in capacitance between adjacent layers can be accomplished.

According to other embodiments of the invention, the one or more pads are designed so that one or more sides that face a routing channel are provided with at least one cut-out or depression. Thereby a reduction in capacitance between adjacent layers of the PCB can be accomplished. The cut-out(s) or depression(s) are preferably arranged so that the radius of the pad is smallest in a direction substantially perpendicular towards a routing channel.

According to embodiments of the invention the pads shaped in accordance with the invention are arranged in both inner and outer signal layers. Thereby the advantages of the invention are achieved in different layers of the PCB.

BRIEF DESCRIPTION OF THE DRAWINGS

Reference will now be made, by way of example, to the accompanying drawings, in which.

DETAILED DESCRIPTION

This section gives detailed description about embodiments of the present invention. FIGS. 1-5 should however only be seen as introductory since these figures describe previously known PCB designs.

The terms via hole and PTH are used interchangeably in the description. A PTH should however be seen as a via hole that protrude the entire PCB. The function of the invention is however not depending on whether the via hole is a PTH or a blind or buried via.

Figure 1:
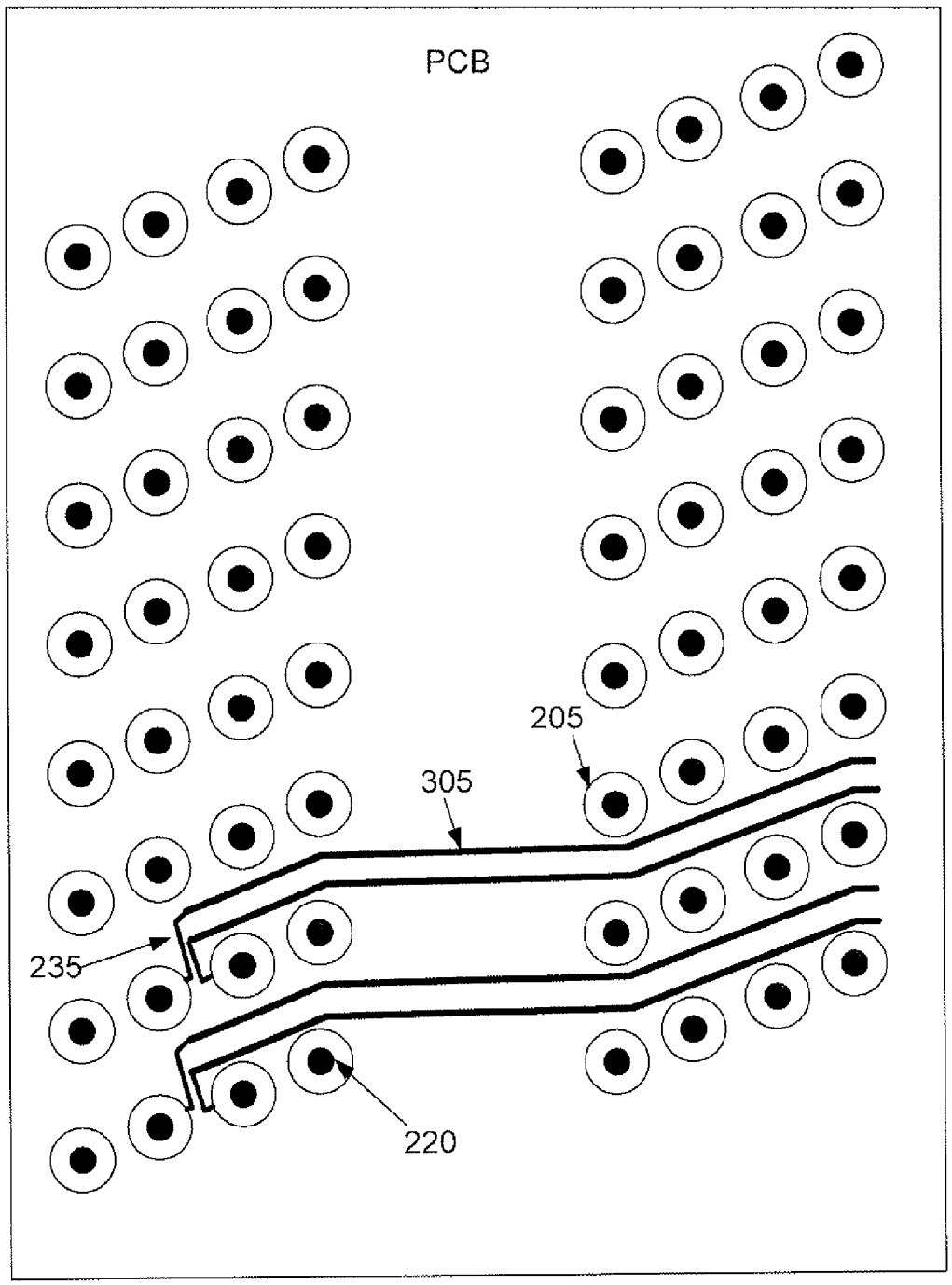
FIG. 1 illustrates an overview of a layer of a PCB according to the prior art.

FIG. 1 illustrates an overview of a layer of a PCB. Routing channels 305 are arranged between rows of pads 205. Some of the pads 205 are connected to routing channels 305 via signal connections 235 and some are not. Via holes or PTHs 220 are arranged in the pads.

Figure 2:
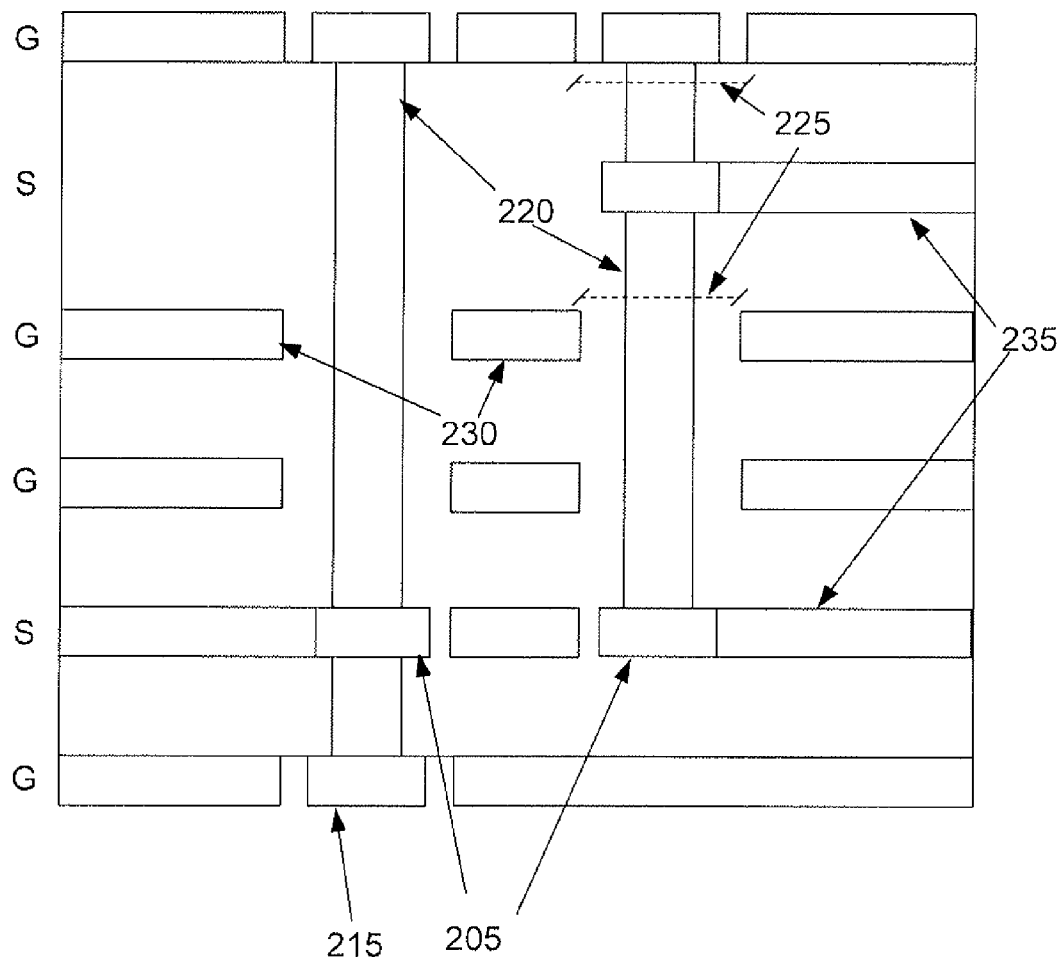
FIG. 2 schematically illustrates a further cross section of a PCB comprising a plurality of layers according to the prior art.

FIG. 2 schematically illustrates a cross section of a PCB comprising a plurality of layers according to the prior art. As can be seen this PCB comprise six layers, three signal layers (also called conductive layers) comprising pads 205 surrounding via holes 220 and signal connections 235 to routing channels (not shown); and three ground layers, G, comprising areas of copper 230 (could of course also be made up of other metals) and anti-pads 225 separating the via holes 220 and the areas of copper 230.

Figure 3:
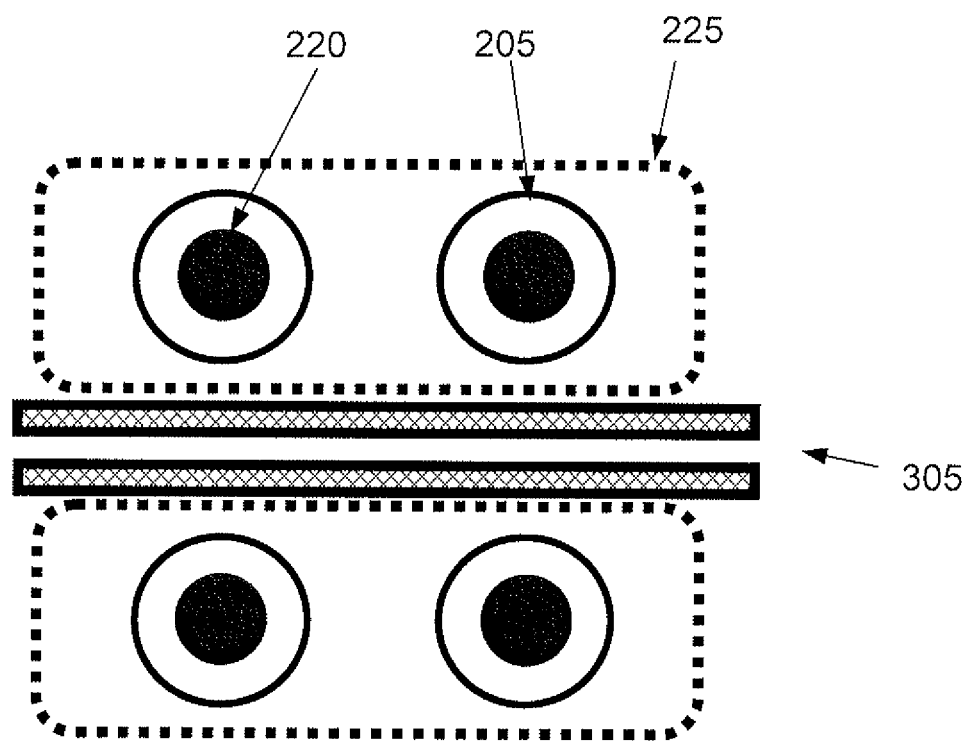
FIG. 3 schematically illustrates a part of a layer of a PCB according to the prior art showing four pads, each with a PTH, and a routing channel. Anti-pads in an adjacent layer are shown with dotted lines.

FIG. 3 schematically illustrates a part of a layer of a PCB, according to the prior art, showing four pads 205, each with a PTH 220, and a routing channel 305, Anti-pads 225 in an adjacent layer are shown with dotted lines.

Figure 4:
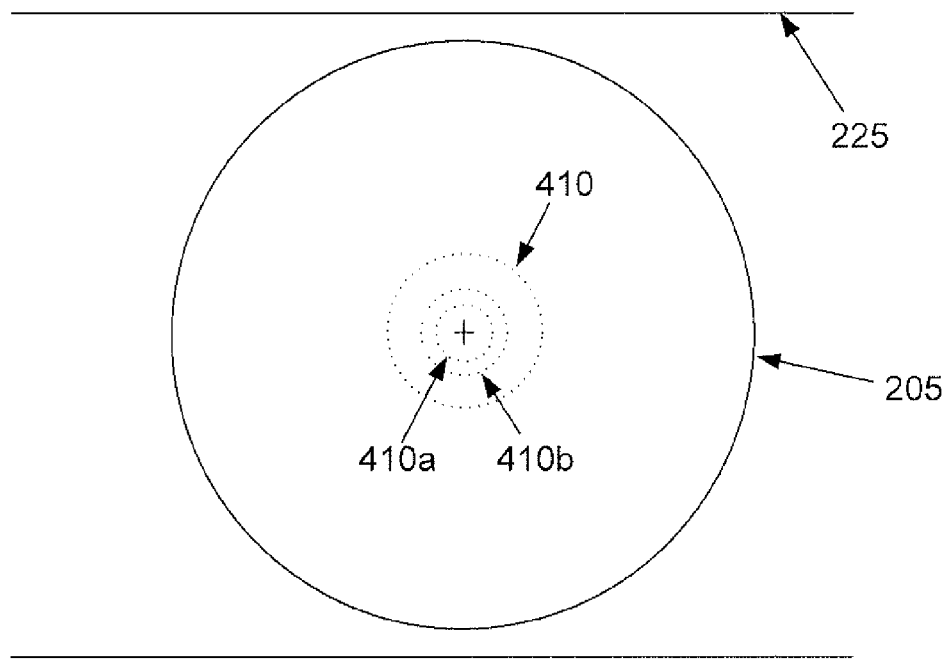
FIG. 4 schematically illustrates a known, circularly shaped pad.

FIG. 4 schematically illustrates a known, circularly shaped pad 205. Illustrated in the figure are also the edges of an anti-pad 225 in an adjacent ground layer. The total manufacturing tolerance 410 is illustrated with a dotted circle and includes in the following examples, tolerance for drill position 410a (the drill may not be positioned exactly where wanted) & layer misalignment 410b (different layers may be misaligned during production). It also includes a drilled hole radius tolerance, i.e. a tolerance for if the drilled hole gets a larger diameter than the drill diameter. The diameter of a PTH 220 will in practice most often lie between the maximum drilled hole diameter and the diameter of the drill. The total manufacturing tolerance is related to the position of the pad 205 and means that the center of a via or a PTH should be within the circle showing the total manufacturing tolerance 410. Instead of defining the total manufacturing tolerance as the sum of drill position tolerance, layer misalignment tolerance and hole diameter tolerance/2; the total manufacturing tolerance may be defined as the sum of drill position tolerance and layer misalignment tolerance and with the hole diameter tolerance included in the predicted diameter of the PTH. In practice, the pad diameter is set to be approximately equal to the predicted diameter of the PTH plus the total manufacturing tolerance. The predicted diameter is equal to a nominal via diameter or the drill diameter. In the following the hole radius tolerance is included in the total manufacturing tolerance.

Figure 5:
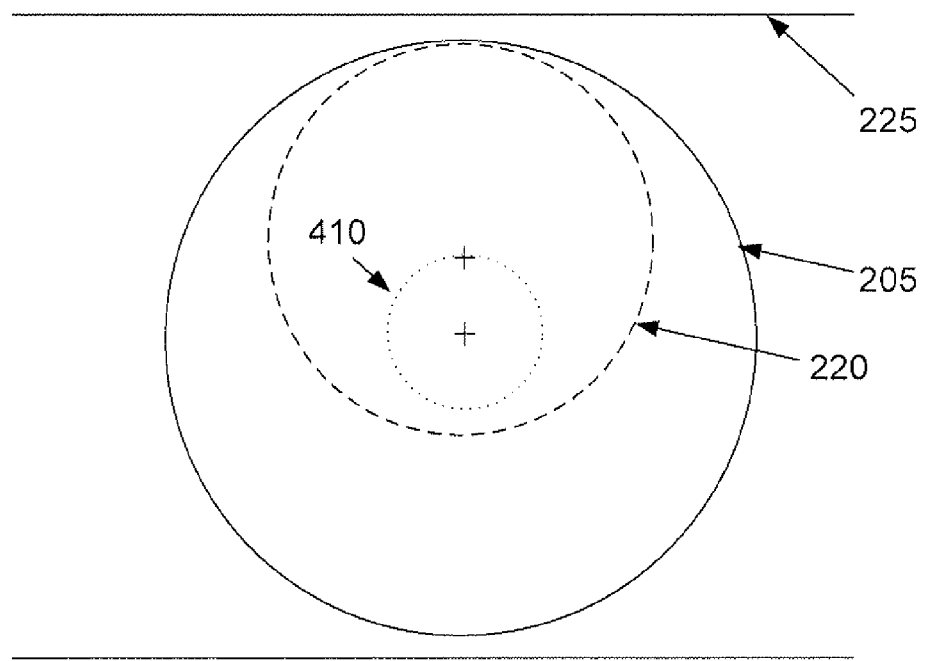
FIG. 5 schematically illustrates a known, circularly shaped pad in which a PTH or via hole is drilled and still being within the manufacturing tolerance.

FIG. 5 schematically illustrates a known, circularly shaped pad 205 in which a PTH or via hole 220 is drilled and still being within the manufacturing tolerance but maximally displaced towards a routing channel. I.e. the centre of the PTH is on the border, or periphery, of the circle showing the manufacturing tolerance 410.

Figure 6:
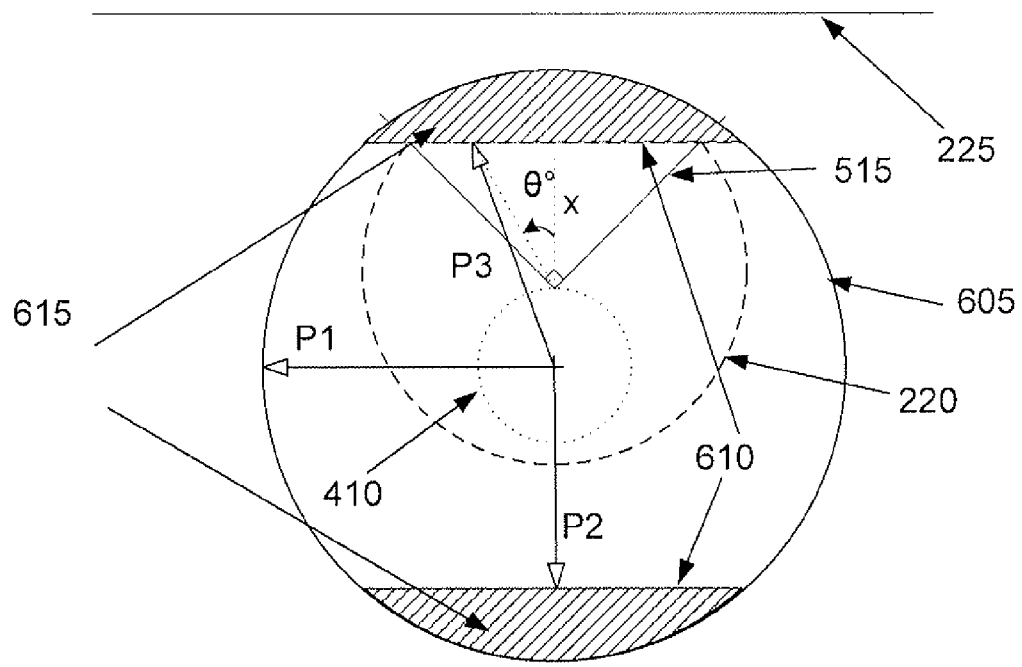
FIGS. 6-8 schematically illustrates a pad in accordance with an embodiment of the invention.

FIG. 6 schematically illustrate a pad 605 shaped in accordance with embodiments of the invention. Instead of the previously known substantially circularly shaped pad, the pad is provided with new edges 610 in the form of straight sides facing the routing channels (the routing channels being parallel to the anti-pads 225). Comparing with a normal pad it is seen as if parts 615 of the pad have been cut out and removed. However, the pad is preferably produced in a manner similar to that of a normal circularly shaped pad. The pad have a shape with a varying radius around the center of the pad, where the radius is smaller in a direction towards at least one routing channel, i.e. in a direction substantially perpendicular to the extension of the routing channel than in a direction in which the routing channel extend. Two lines 515 extend from the centre of the via hole 220 and in a perpendicular fashion towards each other. The points where the lines 515, extending from the centre of the via hole 220, intersect the periphery of the via hole 220 indicate the lower border for the straight sides 610. By such a positioning of the straight sides 610 the shape of the pad may be made so that maximally 25% of the circumference of a PTH is on the outside of the pad as long as the manufacturing tolerance 410 is fulfilled, in order to meet quality level according to IPC (Institute for interconnecting and packaging electronic circuits) Class 2 requirements. This is preferably achieved by removing the parts of the pad that lie above (or below depending on which side of the pad that is to be modified) the intersection between a PTH or via being on the border of the manufacturing tolerance (seen in a direction substantially perpendicular to the extension direction of the routing channel) and a radius extending from the center of the maximally displaced PTH or via and having an angle θ that is inclined 45 degrees to a direction substantially perpendicular to the extension direction of the routing channel.

The angle θ is defined as the angle for a line x originating in the centre of a via hole 220 and being directed towards, and ending on a point on, the edge 610. The angle being 0° in a direction towards the routing channel(s), i.e. perpendicular to its extension direction. The length of the line x then being equal to the radius of the via hole 220 divided by the square root of two, provided that the via hole is maximally displaced related to the pad (seen in a direction substantially perpendicular to the extension direction of the routing channel). The length of a path P3, originating from the centre of the pad and ending in the endpoint of x, is then accordingly, if the angle θ being 0°, equal to the length of x plus the total manufacturing tolerance.

Presume in this embodiment that the via hole 220 has a diameter of 0.55 mm and the total manufacturing tolerance is 0.15 mm, the length of path P3 (θ being 0°, i.e. P3=P2) would then be approximately 0.344 mm provided that the via hole is maximally displaced (seen in a direction substantially perpendicular to the extension direction of the routing channel). This means that a displacement of the via hole of just over 0.069 mm from the centre of the pad would cause a part of the via hole (in a direction substantially perpendicular towards the extension direction of a routing channel) to be located outside of the edge 610. 0.069 mm is in this embodiment approximately 12.6% of the diameter of the via hole. The widest part of the cut-out area 615 is then equal to: the radius of the PTH*(1−1/√2)~the radius of the PTH*0.3=0.08 mm. Since path P1, originating in the center of the pad and substantially in a direction in which adjacent routing channel(s) extend and ending in a point located on the edge of the pad, is approximately equal to the radius of the PTH plus total manufacturing tolerance (=0.425 mm); P2 is approximately 18.8% shorter than P1.

The angle θ is preferably approximately ±45° in a direction towards the points where the lines 515 intersect the periphery of the via hole 220. The length of the line x is in this direction equal to the radius of the via hole 220. The length of the path P3 would then, if the angle θ is equal to ±45°, using the Law of cosines, be equal to: √((length of x)^2+(total manufacturing tolerance)^2−(2*the total manufacturing tolerance*the length of x*cos(135))). The length of x will vary in dependence of the angle θ; Law of sines gives the expression: length of x=(length of radius of via hole)/(√2*sin(135−θ)). After some elaboration this leads the more general expression for the length of the path P3, depending on the angle θ, when the angle θ lies within the interval −45°->+45° (and correspondingly 135°->225° in case the via hole 220 is maximally displaced in the opposite direction): Length of P3=√(((length of radius of via hole)^2)/(2*cos²θ)+(total manufacturing tolerance)^2+(√2*total manufacturing tolerance*length of radius of via hole)).

If the extension direction of the routing channel varies, the relevant extension direction may be taken in the point(s) where the routing channel and the pad are in their closest position.

Figure 7:
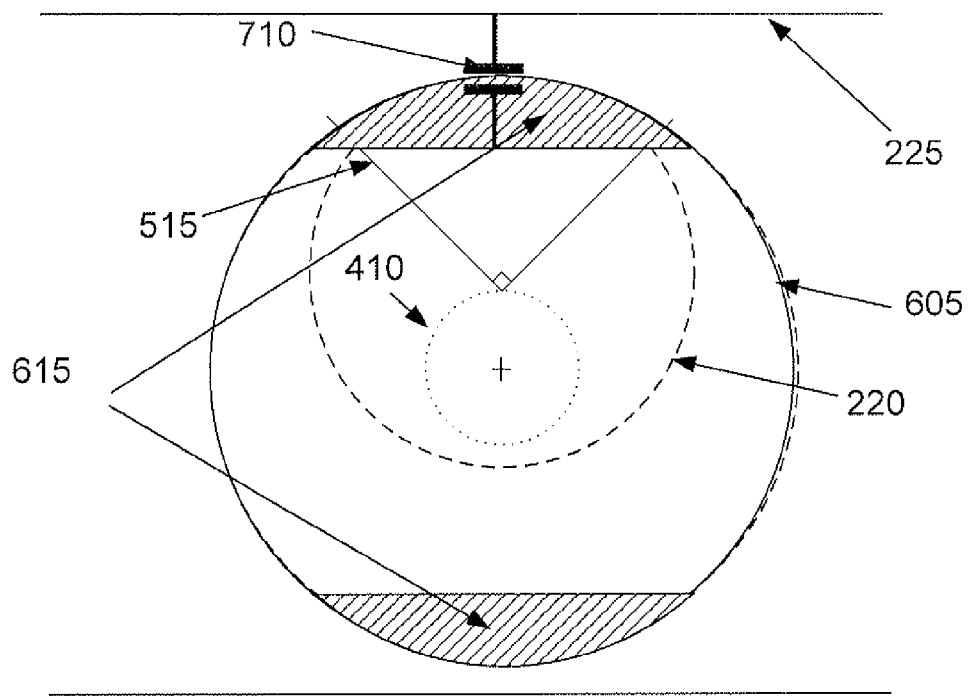

In FIG. 7 the capacitance 710 between the edge of the pad and the corresponding edge of an anti-pad in an adjacent layer has been illustrated. A capacitance that creates reflections in the transmission line is depending on the distance between an edge of a pad and an edge of an anti-pad in an adjacent ground layer. The size of the routing channel for passing transmission lines through a connector foot-print is also depending on the pad and anti-pad dimensions. The size of the routing channel is also affecting the choice of the trace width of the routing channels which in turn is affecting the attenuation of the transmission line. As system bit rates and signal density are increasing the routing channel through the connector foot-prints are a bottleneck when considering high electrical performance and cost effective solutions. Since the capacitance is dependent on the distance between the pad 605 and the anti-pad 225 positioned in an adjacent layer of the PCB, the capacitance 710 will be lower than the corresponding capacitance for a circularly shaped pad 205. However, the designer of the PCB may instead of lowering the capacitance use the extra space to extend the width of the routing channels, leading to no changes to the capacitance.

The routing channels need to be wide enough to handle a specified signal performance and manufacturing tolerances of the PCB. The routing channel is e.g. depending on; connector foot-print depending on connector design, layer-to-layer mis-registration tolerance in PCB production, tolerance of hole drill position in PCB production, size of the drilled hole depending on connector design, clearance between copper areas to achieve best yield in PCB production and size of the pad in order to meet quality level according to IPC requirements. For an optimum electrical performance the routing channel need to consider e.g.; the physical structure of the signal interface (trace width & trace separation), capacitance allowed between via hole pad and adjacent ground layers, ground coverage in adjacent layers and minimum clearance to avoid life time dependent failure modes for PCBs.

Figure 8:
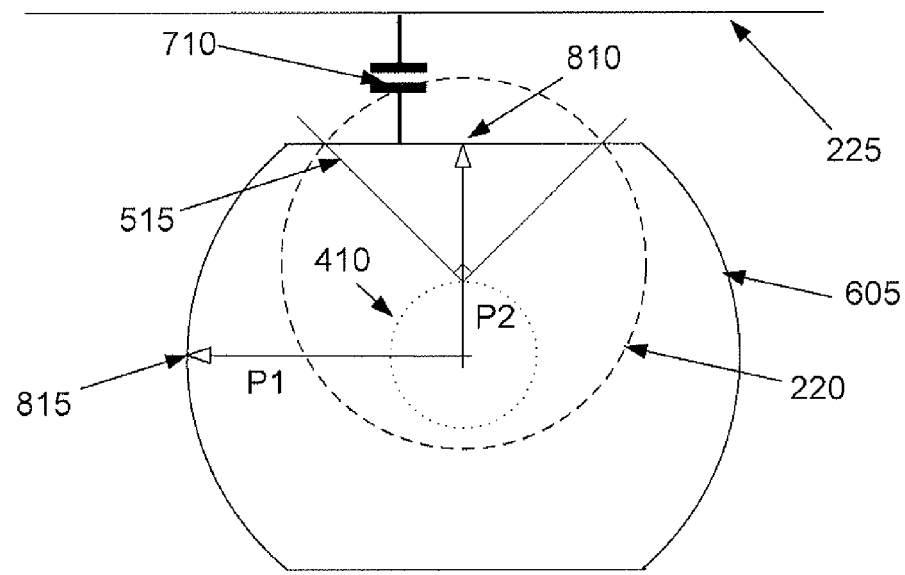

FIG. 8 schematically illustrates a pad 605 shaped in accordance with embodiments of the invention. Further, a via hole 220 is illustrated still being within the manufacturing tolerance but maximally displaced towards a routing channel. Approximately 25% of the periphery of the via hole is outside of the edge of the pad 605. A path P1, stretches from the center of the pad and substantially in a direction in which adjacent routing channel(s) extend, to a point 815 located on the edge of the pad 605. Path P1 is longer than a second path P2, stretching from the center of the pad and substantially in a direction towards the adjacent routing channel(s) 305 to a second point 810 located on the edge of the pad 605. Path P2 is shorter than the radius of the via hole 220 plus the total manufacturing tolerance 410 and substantially equal to the radius of the via hole 220 divided by √2 plus the total manufacturing tolerance. Path P1 is substantially equal to, but may also be longer than, the radius of the via hole 220 plus the total manufacturing tolerance 410.

Figure 9:
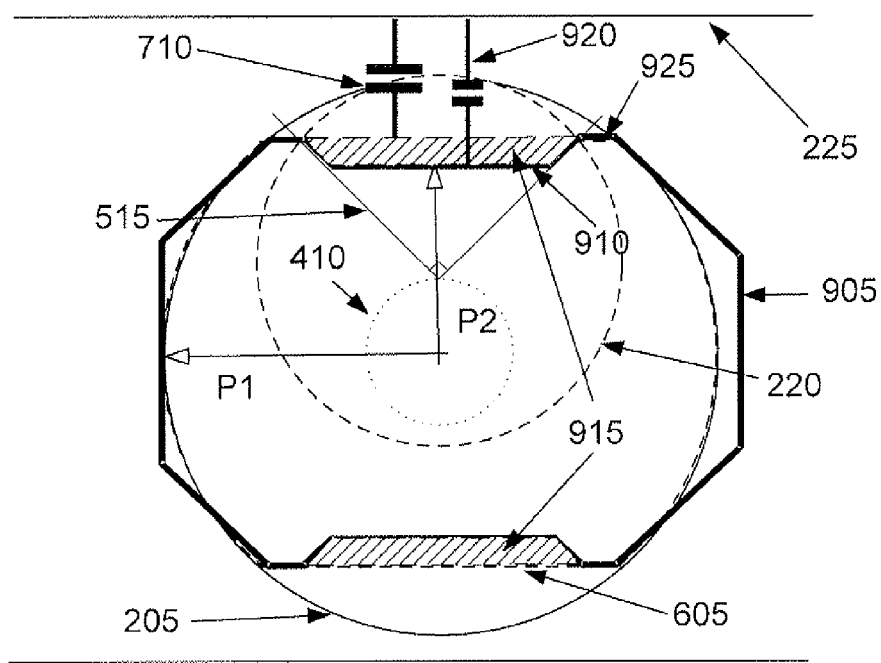
FIGS. 9-10 schematically illustrates a pad in accordance with another embodiment of the invention.

FIG. 9 schematically illustrate a pad 905, shown with straight lines, shaped in accordance with embodiments of the invention. As can be seen in the figure the part of the pad facing the routing channel has been further decreased compared with the pad 605 illustrated in FIGS. 6-8. I.e. an area 915 has been removed from the pad 605 illustrated with reference to FIGS. 6-8. This increases the mean distance between the pad 905 and the corresponding edge of an anti-pad 225 in an adjacent layer, which accordingly also results in a reduced capacitance 920 between them as illustrated in the figure. The distance between the routing channel (parallel to the anti-pad 225) and the closest parts 925 of the pad 905 may be the same as for the pad 605 described with reference to FIGS. 6-8, resulting in that the routing channels may be equally wide in both embodiments. The path P2 ending on the edge of the side 910, facing the routing channel, will thus be shorter than for the previously described pad 605, where the path P2 ended on the side 610. The path P2 should however preferably not be shorter than the radius of the via hole 220 and also not be shorter than the radius of the via hole 220 plus the hole diameter tolerance divided by 2 (or the hole radius tolerance). As can be seen in the figure the parts of pad 905 that is in the extension direction of the routing channels, i.e. not facing the routing channels, is also angularly shaped. The area of the pad is slightly extended in that direction. However, one of the sides can be designed to follow a smooth semi-circular contour and not be extended on that side compared to a normal circularly shaped pad 205, whereas the other side may be angularly shaped and slightly extended in order to secure connection to routing channels. The pad 605 shaped in accordance with FIGS. 6-8 is shown with dashed lines. As can be seen, the shape of the pad is made so that still maximally 25% of the circumference of a PTH, being on the border of the manufacturing tolerance, is on the outside of the pad, in order to meet quality level according to IPC Class 2 requirements. Preferably the length of the further decreased area 915 facing the routing channel is substantially equal to the square root of 2 times the radius of the PTH or via. The sides of the further decreased area 915, defining the edges of the area in the extension direction of the routing channel, is preferably in line with a direction (lines 515) towards the centre of a via or PTH being on the border of the manufacturing tolerance, Irrespective of where the centre of the via hole is positioned within the manufacturing tolerance, at least 75% of the periphery of the via hole will be inside of the pad.

Figure 10:
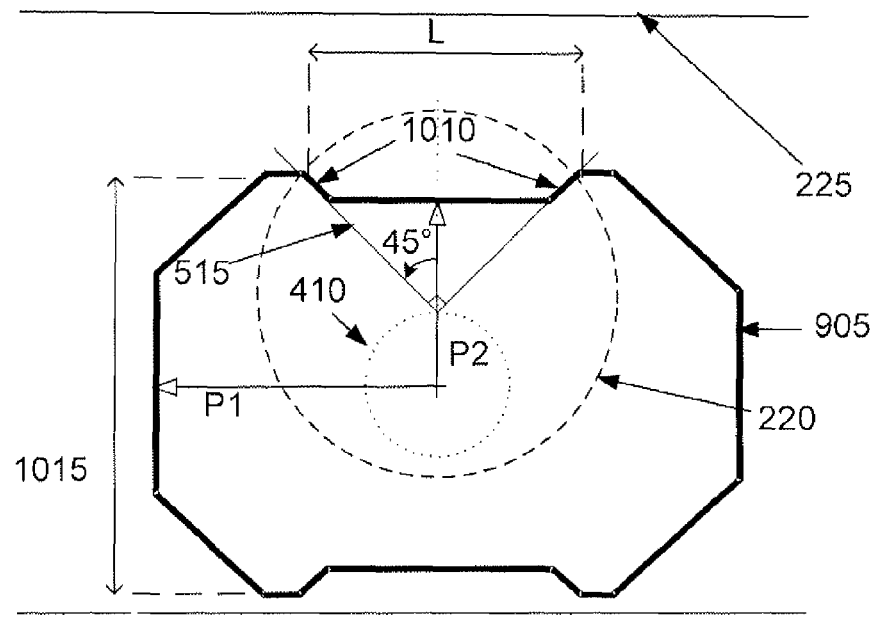

FIG. 10 schematically illustrate a pad similar to the pad illustrated in FIG. 9, but without the inclusion of the pad shaped in accordance with FIGS. 6-8 shown with dashed lines. As can be seen in this figure the leaning sides 1010 of the further decreased area 915 (see FIG. 9), i.e. the sides 1010 that define the edges of the area 915 in the extension direction of the routing channel, or that define the width of the area, is leaning with an angle of substantially 45 degrees seen from the centre of the PTH or via 220. Preferably the length L of the further decreased area is substantially equal to the distance between the intersections of the edge of the pads 605 that has been provided with straight sides in accordance with FIGS. 6-8 and the edges of a PTH or via 220 being on the border of the manufacturing tolerance 410 seen in a direction substantially perpendicular towards the direction of the routing channel. As can be seen the distance 1015, perpendicular towards the extension direction of the routing channel, is longer than twice the length of the path P2. In this embodiment the distance 1015 is equal to 2*(total manufacturing tolerance)+(radius of PTH)*√2.

Figure 11:
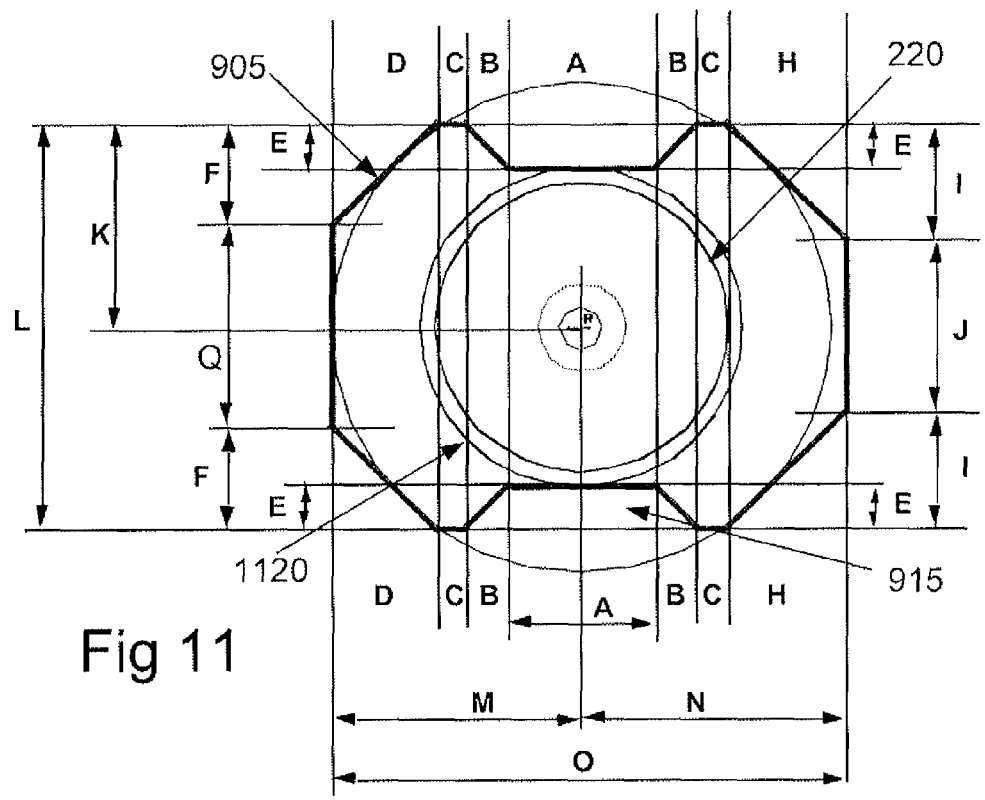
FIG. 11 schematically illustrates an example how a pad according to an embodiment of the invention can be dimensioned.

FIG. 11 schematically illustrates an example of how a pad 905 according to an embodiment of the invention can be shaped and dimensioned. The drilled hole 220 diameter (via or PTH) is 0.55 millimetre, the hole true position (or hole position tolerance) is 0.05 mm, the drilled hole diameter tolerance is 0.05. The layer-to-layer misregistration, i.e. the misregistration between different layers of the PCB is 0.10 mm, resulting in a total manufacturing tolerance of 0.175 mm. The minimum ground coverage in an adjacent layer is 0.05 mm. Nominal distance between the pad and ground in adjacent layer (at no misregistration) is 0.123 mm and the minimum clearance distance between the via hole to ground is 0.100 mm. Further dimensions (all in mm) in this embodiment are as follows: A: 0.298; B: 0.0631; C: 0.0625; D: 0.1763; E: 0.0631; F: 0.1763; Q: 0.3736; H: 0,2013; I: 0.2013; J: 0.3236; K: 0.3631; L: 0.7263; M: 0.451; N: 0.476; and O: 0.927. Shown in the figure is also the maximum drilled hole 1120, i.e. the drilled hole 220 including a drilled hole diameter tolerance. The maximum drilled hole 1120 is having a diameter of 0.60 mm (diameter of via plus hole diameter tolerance).

Presume that the pad 905 would not be provided with further cut-outs 915, the displacement that is required for a via hole 220, having a diameter of 0.55 mm, to be on the outside of the pad, would be equal to 0.0631 (E)+0.025 ((L−2*E−0.55)/2)=0.088 mm≈16% of the diameter of the via hole. However, since the pad is provided with cut-outs, the required displacement in the direction towards a routing channel is approximately 4.5% of the diameter of the via hole. A path P2, stretching from the center of the pad and substantially in a direction perpendicular towards the extension direction of the adjacent routing channel to a point located on the edge of the pad is in this example 33% shorter than a path P1, stretching from the center of the pad and to the left in the figure (length of P1=M). If P1 is chosen to be in the opposite direction (length of P1=N), P2 would be 37% shorter. If no cut-outs would have been provided this figure would be approximately 19% and 24% respectively.

Figure 12:
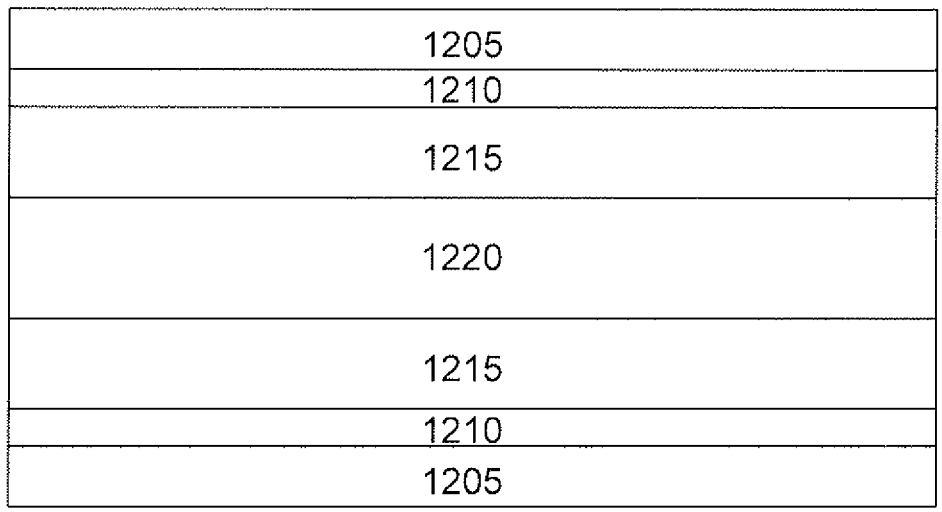
FIGS. 12-13 schematically illustrates examples of how a pad and an adjacent routing channel according to an embodiment of the invention can be arranged.
Figure 12:
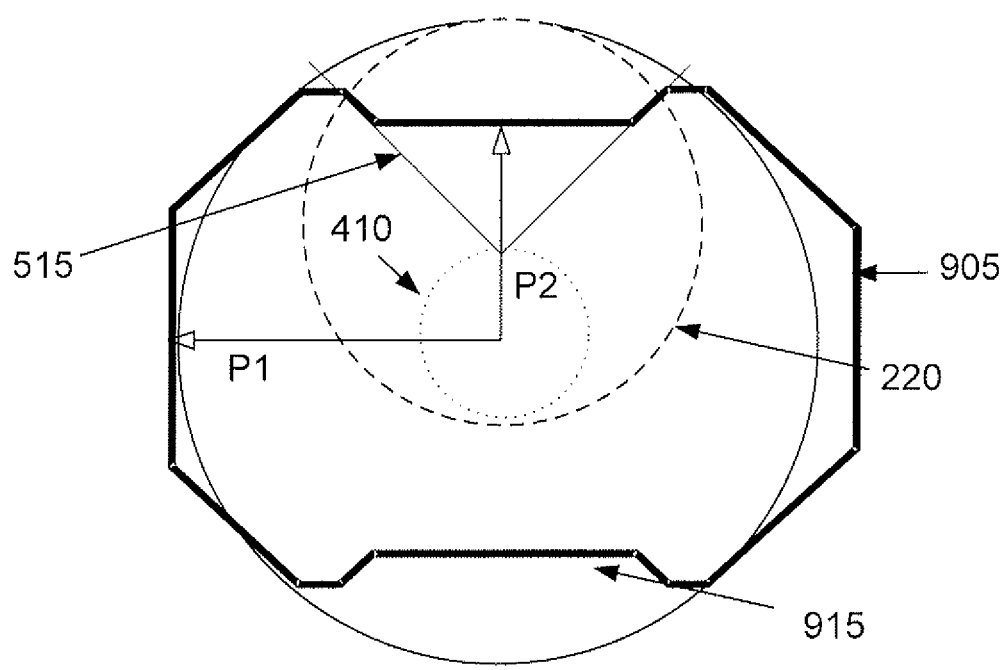

FIG. 12 schematically illustrate an example of a pad and an adjacent routing channel according to an embodiment of the invention. As can be seen in the figure a PTH is shown having a maximum allowed displacement in a direction towards the routing channel. The placement of the PTH 220 is on the border of the manufacturing tolerance seen in a direction substantially perpendicular towards the direction of the routing channel. On the side where the PTH is displaced towards the routing channel, the capacitance between the edge of the PTH and an anti-pad in an adjacent layer will be approximately the same as for a normal, circularly shaped pad since the distance will be approximately the same. However, on the opposite side of the pad the capacitance will be sufficiently reduced so that the total capacitance between the pad and an anti-pad in an adjacent layer will be reduced. In the region above the pad 905, the following may be found: Layer misregistration area 1205, i.e. the area to secure that a pad is not situated directly above or beneath an anti-pad, ground coverage area 1210, trace 1215 of the routing channel and a trace clearance, i.e. the distance between the traces 1215, 1220.

In this example the width of the cut-outs 915 is 0.043 mm, resulting in a path P2 having length 0.30 mm which is equal to the radius of a maximum drilled hole, and thus slightly larger than the predicted radius of the via hole 220 which is 0.275 mm or the radius of a nominal via hole. A maximum drilled hole is equal to a nominal via hole plus the diameter hole tolerance, the diameter hole tolerance in this example being 0.05 mm. This means that a displacement, perpendicular to the extension direction of a routing channel, of the via hole 220 of approximately just over 4.5% of the diameter of the via hole would cause the via hole to be on the outside of the pad. In case no cut-outs were provided, the required displacement would be over 12% and the path P2 would have been approximately 19% shorter than P1. With cut-outs, P2 is approximately 29% shorter than P1.

Figure 13:
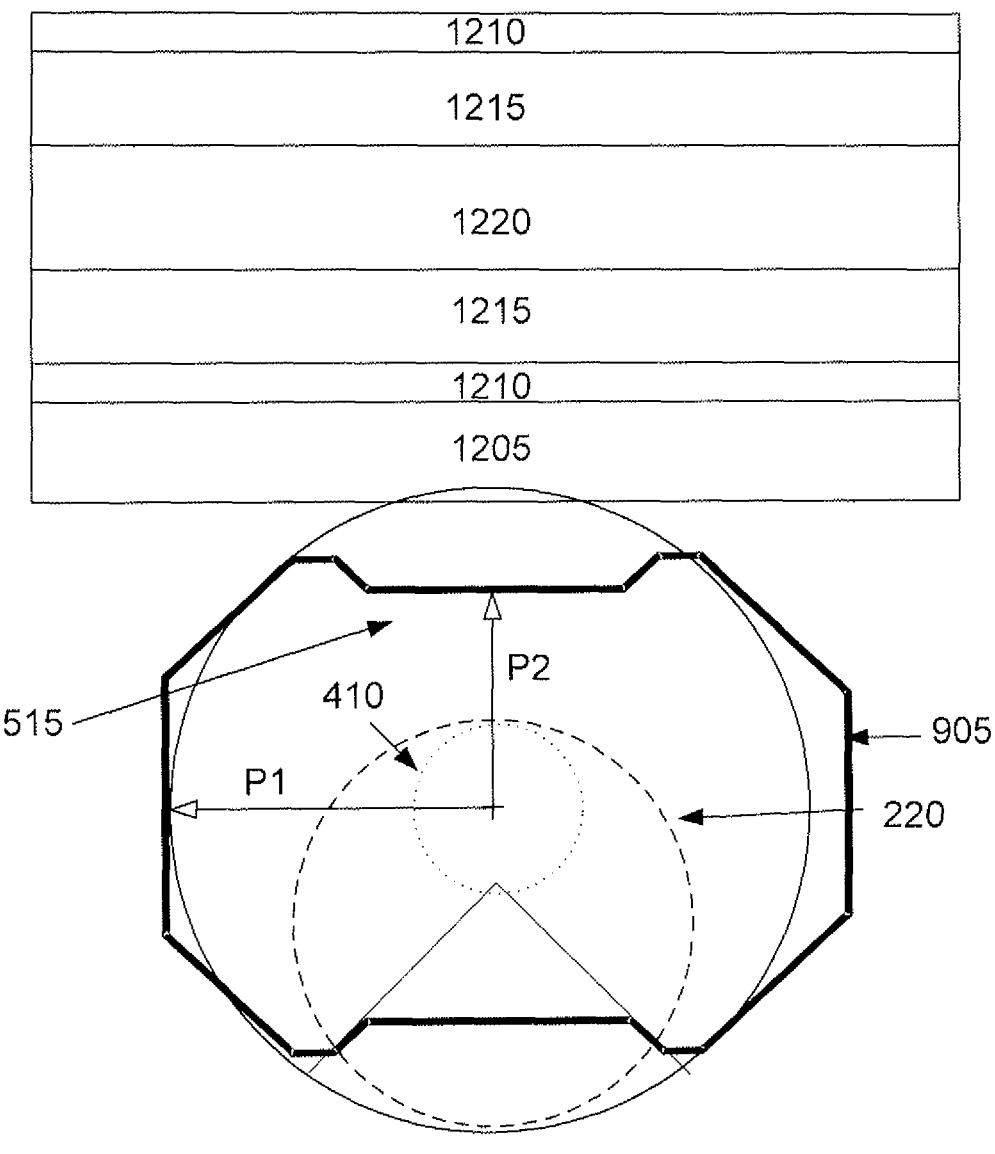

FIG. 13 schematically illustrate an example of a pad and an adjacent routing channel according to an embodiment of the invention. The difference between the embodiments in FIGS. 12 and 13 is that the via holes 220 is maximally displaced in opposite directions. This results in that the traces 1215 will be positioned closer to the pad 905.

Figure 14:
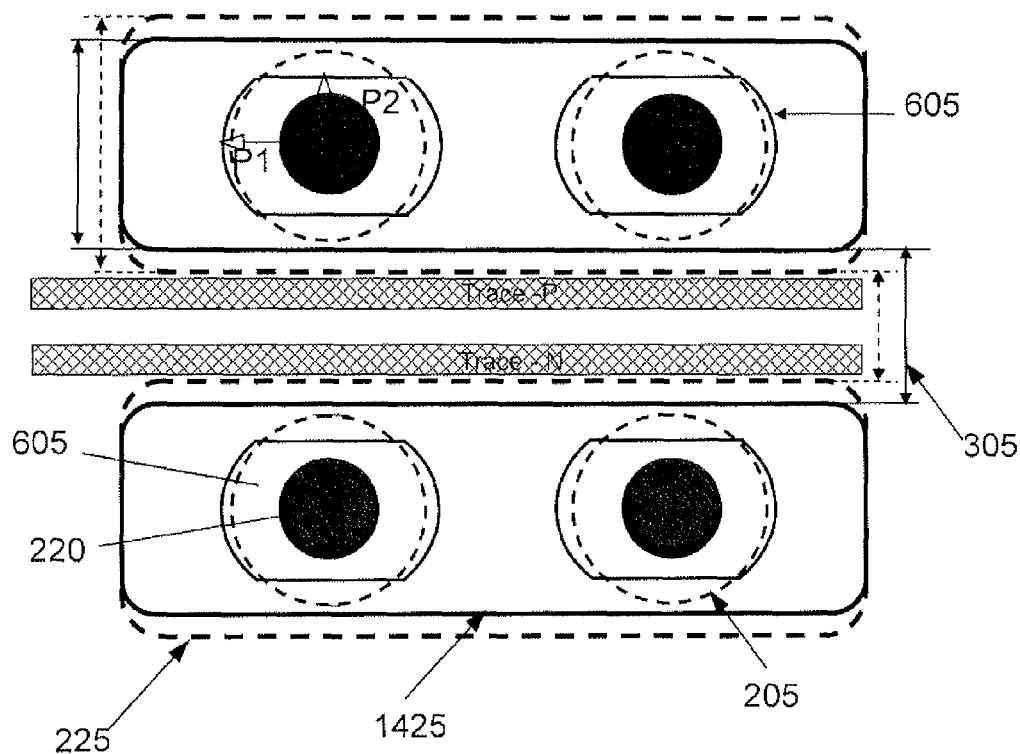
FIG. 14 schematically illustrates a part of a layer of a PCB in accordance with an embodiment of the invention, showing four pads, each with a PTH, and a routing channel, and anti-pads provided in an adjacent layer.

FIG. 14 schematically illustrates a part of a layer of a PCB in accordance with an embodiment of the invention, showing four pads 605, each with a PTH 220, and a routing channel 305, and anti-pads 1425 provided in an adjacent layer. As can be seen from the figure the pads 605 are provided with flat, straight sides facing the routing channel 305 and preferably being substantially parallel to the extension direction of the routing channel. By designing the pads 605 as shown in the figure, the anti-pads 1425 can be made smaller (less wide) which result in that the routing channels can be made larger (wider). Previous designs are illustrated with dashed lines including a circularly shaped pad 205, wide anti-pads 225 and narrow routing channels 305. The pad design according to the embodiment may also results in a reduced capacitance. The pad design makes it possible for a PCB designer to choose between wider routing channels or smaller capacitance, or a mix of the two. In this embodiment the pads are also slightly extended in the extension directions of the routing channel. A reason for extending the pads in the extension direction of the routing channel may be to make it easier to secure connections to the pads.

Figure 15:
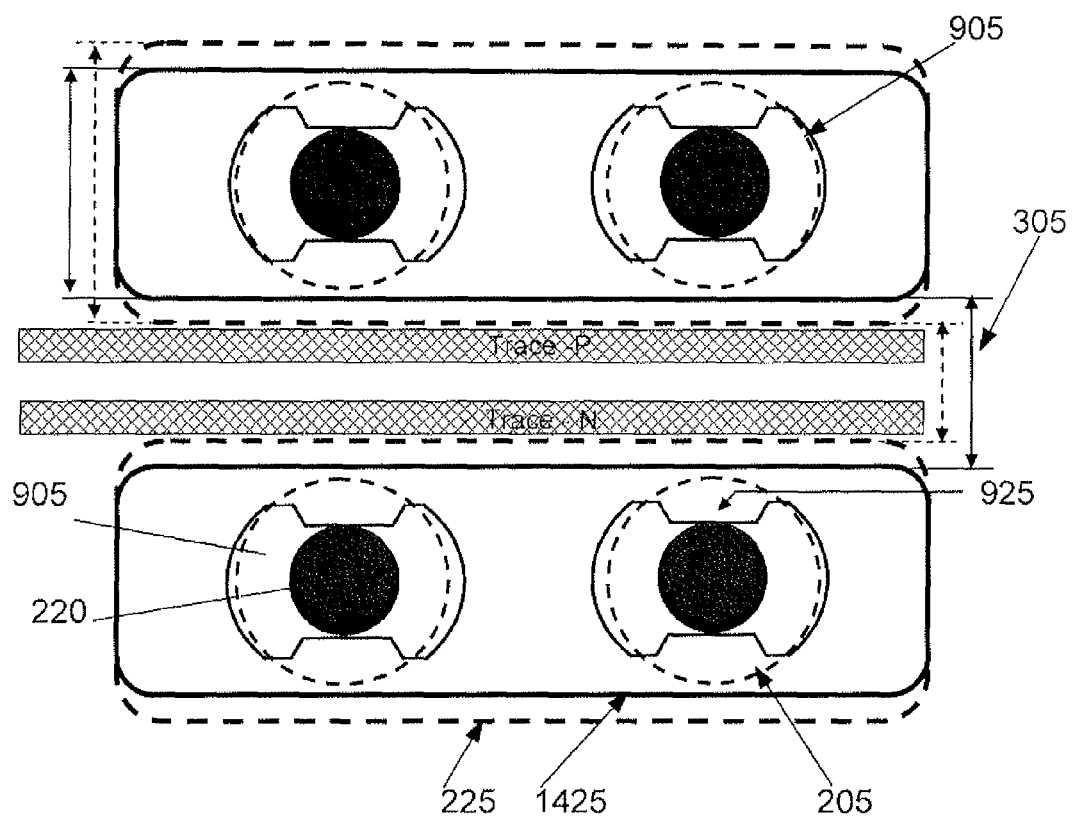
FIG. 15 schematically illustrates a part of a layer of a PCB in accordance with an embodiment of the invention, showing four pads, each with a PTH, and a routing channel, and anti-pads provided in an adjacent layer.

FIG. 15 schematically illustrates a part of a layer of a PCB in accordance with an embodiment of the invention, showing four pads 905, each with a PTH 220, and a routing channel 305, and anti-pads 1425 provided in an adjacent layer. As can be seen from the figure the pads are provided with sides with at least one depression 925 on the sides facing the routing channel compared to the embodiment shown in FIG. 14 where the sides were substantially straight. By changing the design of the pad by having less copper between the centre of the pad and the routing channel—thereby reducing the area of the pad in a direction substantially perpendicular to the extension direction of the routing channels in comparison with ordinary circular pads and with pads shown in e.g. FIG. 14—the capacitance between the pad and anti-pads in adjacent ground layers will be reduced. The length of this area 925, seen in the extension direction of the routing channels could be approximately between 50-75% of the diameter of the PTH or via. Preferably, the length L (see FIG. 10) is approximately $1/\sqrt{2}$ times the diameter of the PTH, or shorter. The width of this area could be approximately between 10-15% of the diameter of the PTH or via. The maximum width of this area, unless the path P2 shall be shorter than the radius of the PTH, may be expressed as: width, w=total manufacturing tolerance+radius of PTH*$(1/\sqrt{2}-1)$. Previous designs are illustrated with dashed lines including a circularly shaped pad 205, wide anti-pads 225 and narrow routing channels 305. The final shape of the pads 905 can comprise smooth outer edges as shown in e.g. FIG. 14 and/or several segments with specified length as shown in FIG. 10. The periphery may thus be angularly shaped and/or have smooth transitions between different sections of the periphery.

An object of the invention is to provide a printed circuit board with a design that allows wide routing channels at the same time as a low capacitance between adjacent layers can be accomplished. A further object is to achieve the above mentioned object while also fulfilling the IPC Class 2 requirement of maximum 90 degrees breakout of the periphery of the via or PTH, from pads in inner layers. This means that only 25% of the circumference of a via or PTH is allowed to be outside of the periphery of an inner layer pad. Therefore the pads in inner or outer signal layers (conductive layers) should be construed so that the risk that more than 25% of the circumference of the PTH or via will be provided outside of the pad is equal to, or less than the corresponding risk with regular circular inner (or outer) layer pads. Pads construed in accordance with the present invention fulfil all of the above mentioned objects.

By cutting the pads at both sides and/or by providing cut outs or depressions as mentioned in the embodiments above an increased width for the routing channels may be accomplished. Increased widths of routing channels make it possible to secure ground coverage underneath the signal traces in adjacent layers, which result in reduced crosstalk and reduced impedance variations. Resonances depending on periodic discontinuities are also avoided. Wider routing channels result in wider traces, which in turn result in less insertion loss and less variation of the impedance depending on manufacturing tolerances regarding trace width. Further, wider routing channels allow increased manufacturing tolerances in PCB production resulting in lower cost.

By cutting the pads at both sides and/or by providing cut outs or depressions as mentioned in the embodiments above, the distance between the edge of a pad and the corresponding edge of an anti-pad arranged in adjacent ground layer will increase, resulting in a reduced capacitance between the layers. Reduced capacitance between pads and anti-pads in adjacent ground layers result in improved signal performance of the interconnection, depending on reduced discontinuities and an improved return loss.

With a balance between the advantages above an increased signal performance can be combined with reduced cost and still meet the quality requirements according to IPC.

Figure 16:
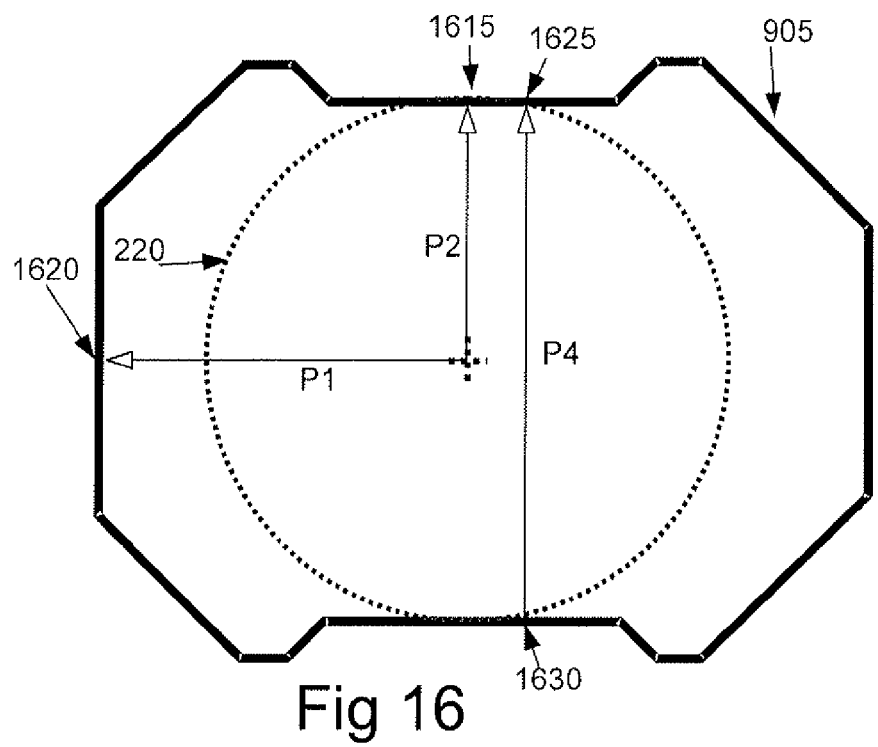
FIGS. 16-19 schematically illustrates different examples of how a pad according to embodiments of the invention can be shaped.

FIG. 16 schematically illustrates an example of how a pad according to a preferred embodiment of the invention can be shaped. As can be seen from the figure the distance or length of path P2 is substantially equal to the radius of the PTH 220. Alternatively, the distance or length of path P2 is substantially equal to the radius of the PTH 220+the hole diameter tolerance/2. In accordance with embodiments of the invention there should always be a path P4 between two points, 1625 and 1630, on the pad 905, arranged on opposite sides of the pad, that have a distance that is substantially equal to the diameter of the PTH. In accordance with alternative embodiments of the invention the distance of path P2 may be substantially equal to the diameter of the PTH+the hole diameter tolerance. In accordance with further alternative embodiments of the invention the distance of path P2 may be, up to about 20% longer that the radius of the PTH, but preferably not more than 10% longer.

Figure 17:
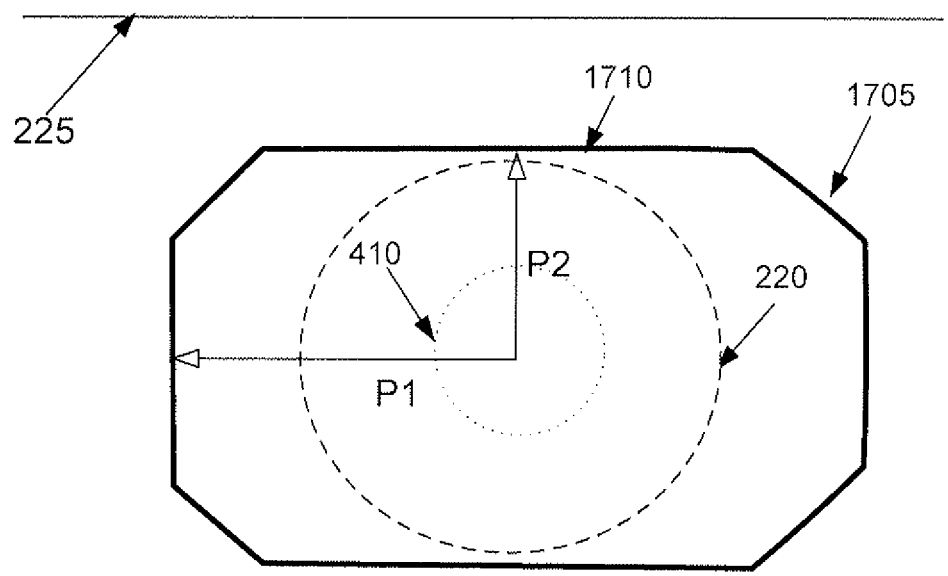

FIG. 17 schematically illustrates an example of how a pad according to an embodiment of the invention can be shaped. In the figure the width of the pad 1705 is substantially equal to the diameter of the via hole 220+the hole diameter tolerance or equal to a maximum drilled hole diameter. A slight displacement of the via hole 220 in any direction, except parallel to the routing channel, would cause the via hole to be outside of the pad. No displacement of the via hole that is within the manufacturing tolerance 410 will however result in that more than 50% of the via hole is outside of the pad. Further, the via hole will not be outside of the pad in two different regions. Therefore, the pad 1705 fulfils the requirement of IPC Class 1. By having very high demands on the manufacturing tolerance, i.e. a small area 410 in which the centre of the via hole is allowed to be placed, the pad 1705 can also fulfil requirement of IPC Class 2.

Figure 18:
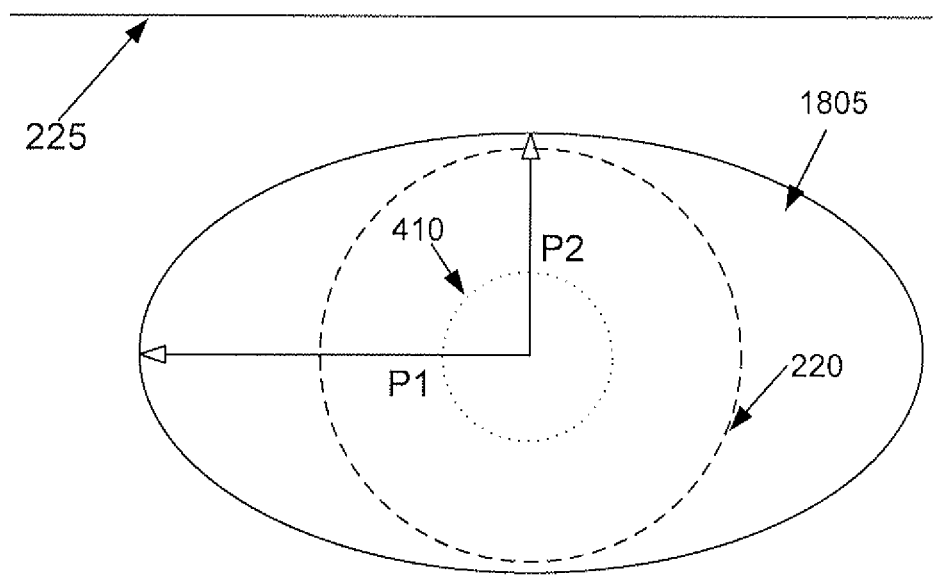

FIG. 18 schematically illustrates an example of how a pad according to an embodiment of the invention can be shaped. As can be seen from the figure the width of the pad 1805 is, in its widest place, slightly larger than the diameter of the via hole 220. A slight displacement of the via hole 220 in any direction, except parallel to the routing channel, would cause the via hole to be outside of the pad. No displacement of the via hole that is within the manufacturing tolerance 410 will however result in that more than 50% of the via hole is outside of the pad. Further, the via hole will not be outside of the pad in two separate regions. Therefore, the pad 1805 fulfils the requirement of IPC Class 1. By having very high demands on the manufacturing tolerance, i.e. a small area 410 in which the centre of the via hole is allowed to be placed, the pad 1805 can also fulfil requirement of IPC Class 2.

Figure 19:
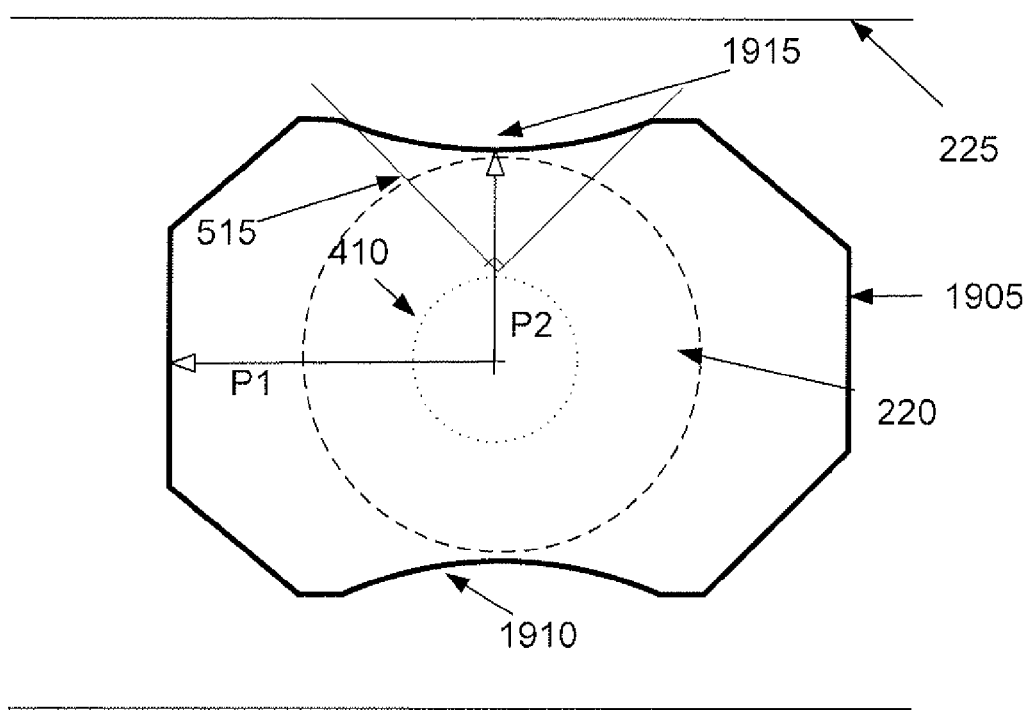

FIG. 19 schematically illustrates an example of how a pad according to an embodiment of the invention can be shaped. As can be seen from the figure a part of the side 1910 facing the routing channels are curved towards the centre of the pad. The pad 1905 is thus provided with a cut-out or depression 1915. This embodiment decreases the capacitance since it increases the mean distance to the anti-pads in a similar fashion to the pad 905.

The present invention may of course, be carried out in other specific ways than those herein set forth without departing from the essential characteristics of the invention. The present embodiments are, therefore, to be considered in all respects as illustrative and not restrictive and all changes coming within the meaning and equivalency range of the appended claims are intended to be embraced therein.

The invention claimed is:

1. A Printed circuit board, PCB, comprising:
  a number of signal layers (S) comprising routing channels;
  at least one ground layer (G) being adjacent to at least one signal layer (S); and
  a number of via holes connecting different signal layers (S) of the PCB, the via holes being connected to pads in the signal layers (S) and surrounded by anti-pads in the ground layer(s) (G); wherein,
  one or more pads having a shape wherein a first path (P1), stretching from the center of the pad and substantially in a direction in which adjacent routing channel(s) extend, to a first point located on the edge of the pad, is longer than a second path (P2), stretching from the center of the pad and substantially in a direction perpendicular towards the extension direction of the adjacent routing channel(s) to a second point located on the edge of the pad; and
  the second path (P2) being shorter than the radius of the via hole plus the total manufacturing tolerance.

2. A PCB according to claim 1, wherein the first path (P1) is equal to, or longer than, the radius of the via hole plus the total manufacturing tolerance.

3. A PCB according to claim 1, wherein the second path (P2) is shorter than the radius of the via hole divided by $\sqrt{2}$, plus the total manufacturing tolerance.

4. A PCB according to claim 1, wherein the second path (P2) is shorter than 1.2 times the radius of the via hole.

5. A PCB according to claim 1, wherein the second path (P2) is shorter than 1.1 times the radius of the via hole.

6. A PCB according to claim 1, wherein the second path (P2) is approximately equal to the radius of the via hole.

7. A PCB according to claim 1, wherein the second path (P2) is substantially equal to the radius of the via hole plus a hole diameter tolerance divided by 2.

8. A PCB according to claim 1, wherein the pads are designed so that one or more sides that face a routing channel make up a straight line for at least a certain distance.

9. A PCB according to claim 1, wherein the pads are designed so that one or more sides that face a routing channel are at least partially curved.

10. A PCB according to claim 1, wherein the pads are provided with at least one cut-out or depression on one or more sides that face a routing channel.

11. A PCB according to claim 10, wherein one or more sides of said cut-out or depression is leaning with an angle of approximately 45 degrees or more.

12. A PCB according to claim 10, wherein the length (L) of the cut-out or depression is equal to, or less than $\sqrt{2}$ times the radius of the via hole.

13. A PCB according to claim 1, wherein the pads consists of smooth outer edges and/or several segments with specified length.

14. A PCB according to claim 1, wherein the pads are arranged in both inner and outer signal layers (S).

15. A PCB according to claim 1, wherein the second path (P2) is shorter than the radius of the via hole plus the total manufacturing tolerance, but longer than radius of the via hole divided by $\sqrt{2}$ plus the total manufacturing tolerance.

16. A PCB according to claim 3, wherein the second path (P2) is longer than the radius of the via hole plus a hole diameter tolerance divided by 2.

17. A Printed circuit board, PCB, comprising:
  a number of signal layers (S) comprising routing channels;
  at least one ground layer (G) being adjacent to at least one signal layer (S); and
  a number of via holes connecting different signal layers (S) of the PCB, the via holes being connected to pads in the signal layers (S) and surrounded by anti-pads in the ground layer(s) (G); wherein,
  one or more pads having a shape wherein a first path (P1), stretching from the center of the pad and substantially in a direction in which adjacent routing channel(s) extend, to a first point located on the edge of the pad, is longer than a second path (P2), stretching from the center of the pad and substantially in a direction perpendicular towards the extension direction of the adjacent routing channel(s) to a second point located on the edge of the pad, wherein the second path (P2) is longer than the radius of the via hole but shorter than, or approximately equal to, the length of the first path (P1) minus 0.3 times the radius of the via hole.

* * * * *